United States Patent
Kim et al.

(10) Patent No.: US 11,238,818 B2
(45) Date of Patent: *Feb. 1, 2022

(54) DISPLAY MODULE INCLUDING ELECTRO-STATIC DISCHARGE PROTECTION CIRCUIT

(71) Applicant: SAMSUNG ELECTRONICS CO., LTD., Suwon-si (KR)

(72) Inventors: Jinho Kim, Suwon-si (KR); Sangmin Shin, Suwon-si (KR); Hoseop Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/154,077

(22) Filed: Jan. 21, 2021

(65) Prior Publication Data

US 2021/0142748 A1 May 13, 2021

Related U.S. Application Data

(63) Continuation of application No. 16/263,911, filed on Jan. 31, 2019, now Pat. No. 10,930,231.

(30) Foreign Application Priority Data

Mar. 27, 2018 (KR) .................. 10-2018-0035126
Jan. 17, 2019 (KR) .................. 10-2019-0006337

(51) Int. Cl.
  *G09G 3/36* (2006.01)
  *G09G 3/32* (2016.01)
  *H01L 27/12* (2006.01)
(52) U.S. Cl.
  CPC ............ *G09G 3/3607* (2013.01); *G09G 3/32* (2013.01); *G09G 3/3648* (2013.01); *H01L 27/1214* (2013.01)

(58) Field of Classification Search
  CPC .... G09G 3/32; G09G 2330/04; G09G 3/3607; G09G 3/3648; G09G 2300/026;
  (Continued)

(56) References Cited

U.S. PATENT DOCUMENTS 5,671,026 A 9/1997 Shiraki et al.
6,081,307 A 6/2000 Ha
(Continued)

FOREIGN PATENT DOCUMENTS

CN 107564462 A 1/2018
JP 2003-157026 A 5/2003
(Continued)

OTHER PUBLICATIONS

Communication dated Jan. 22, 2021, from the European Patent Office in European Application No. 19774777.7.
(Continued)

*Primary Examiner* — Temesghen Ghebretinsae
*Assistant Examiner* — Ivelisse Martinez Quiles
(74) *Attorney, Agent, or Firm* — Sughrue Mion, PLLC

(57) ABSTRACT

A display module including a plurality of pixels is provided. The display module according to an embodiment includes a plurality of inorganic light emitting elements constituting the plurality of pixels, a plurality of pixel circuits provided for each of the plurality of inorganic light emitting elements and providing a driving current corresponding to an applied grayscale data voltage to each of the plurality of inorganic light emitting elements, and an ESD (Electro Static Discharge) protection circuit arranged in at least one of the plurality of pixel circuits.

20 Claims, 20 Drawing Sheets

(58) Field of Classification Search
CPC ... G09G 3/30; H01L 27/0248; H01L 27/1214; H01L 27/0296; H01L 27/0266; H01L 27/156; H01L 27/3276; H01L 27/124
See application file for complete search history.

(56) References Cited

U.S. PATENT DOCUMENTS

| | | | |
|---|---|---|---|
| 6,624,870 | B1 | 9/2003 | Greene et al. |
| 6,626,870 | B1 | 9/2003 | Yarborough et al. |
| 7,110,229 | B2 | 9/2006 | Yang et al. |
| 10,008,610 | B2 | 6/2018 | Park |
| 2005/0285984 | A1 | 12/2005 | Tsai et al. |
| 2007/0115662 | A1 | 5/2007 | Roberts et al. |
| 2009/0279008 | A1 | 11/2009 | Lee et al. |
| 2010/0156770 | A1 | 6/2010 | Shin et al. |
| 2014/0361301 | A1* | 12/2014 | Huang ............... H01L 27/1248 257/59 |
| 2015/0092128 | A1* | 4/2015 | Lee .................... G02F 1/13452 349/40 |
| 2016/0210895 | A1 | 7/2016 | Fan et al. |
| 2017/0062514 | A1 | 3/2017 | Park |
| 2017/0167703 | A1 | 6/2017 | Cok |
| 2017/0287399 | A1 | 10/2017 | Ahmed et al. |
| 2018/0138256 | A1* | 5/2018 | Han .................... G09G 3/3266 |
| 2018/0269328 | A1 | 9/2018 | Park |
| 2020/0090578 | A1* | 3/2020 | Hsiao .................. G09G 3/2003 |

FOREIGN PATENT DOCUMENTS

| | | |
|---|---|---|
| JP | 2006-154034 A | 6/2006 |
| KR | 10-2007-0092561 A | 9/2007 |
| KR | 10-2009-0072297 A | 7/2009 |
| KR | 10-2017-0026954 A | 3/2017 |
| KR | 10-2017-0027349 A | 3/2017 |
| KR | 10-2017-0077681 A | 7/2017 |
| KR | 10-2017-0077917 A | 7/2017 |
| WO | 01/11421 A1 | 2/2001 |
| WO | 2016/114909 A1 | 7/2016 |

OTHER PUBLICATIONS

Written Opinion (PCT/ISA/210) dated May 17, 2019 by the International Searching Authority in International Patent Application No. PCT/KR2019/001342.
Communication dated Nov. 21, 2019, issued by the Korean Intellectual Property Office in corresponding Korean Application No. 10-2019-0006337.
International Search Report (PCT/ISA/210) dated May 17, 2019 by the International Searching Authority in International Patent Application No. PCT/KR2019/001342.

* cited by examiner

CONVENTIONAL ART

CONVENTIONAL ART

CONVENTIONAL ART

DISPLAY MODULE INCLUDING ELECTRO-STATIC DISCHARGE PROTECTION CIRCUIT

CROSS-REFERENCE TO RELATED APPLICATIONS

This application is a continuation of U.S. patent application Ser. No. 16/263,911, filed on Jan. 31, 2019, which claims priority under 35 U.S.C. § 119 from Korean Patent Application No. 10-2018-0035126, filed on Mar. 27, 2018, in the Korean Intellectual Property Office, and Korean Patent Application No. 10-2019-0006337, filed on Jan. 17, 2019, in the Korean Intellectual Property Office, the disclosures of which are incorporated herein by reference in their entirety.

BACKGROUND

1. Field

Devices and methods consistent with what is disclosed herein relate to a display module, and more particularly, to a bezel-less display module.

2. Description of the Related Art

A conventional display panel comprises an electro-static discharge (ESD) protection circuit to prevent damage to an element provided in a pixel circuit from electro-static discharge (ESD). A semiconductor chip forming the pixel circuit is integrated. Therefore, the ESD protection circuit is provided in order to avoid damage to the pixel circuit caused by static electricity input through a pad of the semiconductor chip.

The ESD protection circuit may include a resistance, a diode, a bipolar junction transistor (BJT), and the like. The ESD protection circuit may be disposed in a bezel area of a display panel to protect a pixel circuit from static electricity.

However, it has been practically difficult to realize a bezel-less display panel due to the ESD protection circuit in a bezel area of the display panel. Such bezel may be a block to miniaturization of the display panel, and at the time of embodying a display panel in which a plurality of display modules are connected in a tile type, visibility may be deteriorated due to the presence of the bezel.

Therefore, there is a need for a technique for realizing a completely bezel-less display panel.

SUMMARY

An aspect of the embodiments relates to providing a completely bezel-less display panel capable of ESD protection.

In accordance with an aspect of the disclosure, there is provided a display module including a plurality of inorganic light emitting elements constituting the plurality of pixels, a plurality of pixel circuits provided for each of the plurality of inorganic light emitting elements and providing a driving current corresponding to an applied grayscale data voltage to each of the plurality of inorganic light emitting elements, and an ESD (Electro Static Discharge) protection circuit arranged in at least one of the plurality of pixel circuits.

Each of the plurality of inorganic light emitting elements may be mounted on a corresponding pixel circuit to be electrically connected to a corresponding pixel circuit among the plurality of pixel circuits formed on a substrate.

The plurality of pixel circuits may form a Thin Film Transistor (TFT) layer on the substrate, wherein the ESD protection circuit is included in the TFT layer.

The plurality of pixels may be arranged in an entire area of the substrate at predetermined intervals.

The display module may be one display module included in a display panel in which the plurality of display modules are consecutively arranged, wherein intervals between pixels arranged in an edge area adjacent to a first display module and a second display module adjacent to the first display module among the plurality of display modules are identical to the predetermined intervals.

The ESD protection circuit may be arranged in a unit of a pixel circuit of a predetermined number.

The ESD protection circuit may be arranged in a pixel circuit disposed in an edge area of the display module.

The ESD protection circuit may be connected to at least one of a scan line, a data line, a power supply line, and a ground line of at least one of the plurality of pixel circuits.

The ESD protection circuit may be an ESD protection circuit of first type including two thin film transistors (TFTs) for bypassing static electricity flowing through the data line or the power supply line to the ground line.

The ESD protection circuit may be an ESD protection circuit of second type including a transistor that allows the scan line, the data line, the power supply line, and the ground line to have equal potentials by a capacitive coupling effect.

The scan line, the data line, and the ground line may be connected to an ESD protection circuit of first type including two thin film transistors (TFTs) for bypassing static electricity flowing through the data line to the ground line, wherein the power supply line is connected to an ESD protection circuit of second type including a transistor that allows the scan line, the data line, the power supply line, and the ground line to have equal potentials by a capacitive coupling effect. According to the above-described various exemplary embodiments, it is possible to realize a bezel-less display panel without a bezel area while protecting a display panel from ESD.

In accordance with an aspect of the disclosure, a display module includes a plurality of inorganic light emitting elements constituting a plurality of pixels; a plurality of pixel circuits comprising a pixel circuit provided for each respective inorganic light emitting element from among the plurality of inorganic light emitting elements, the plurality of pixel circuits providing a driving current corresponding to an applied grayscale data voltage to each respective inorganic light emitting element from among the plurality of inorganic light emitting elements; and an electro-static discharge (ESD) protection circuit arranged in at least one pixel circuit from among the plurality of pixel circuits.

Each inorganic light emitting element from among the plurality of inorganic light emitting elements may be mounted on and electrically connected to a corresponding pixel circuit from among the plurality of pixel circuits, the plurality of pixel circuits being formed on a substrate.

The plurality of pixel circuits may form a thin film transistor (TFT) layer on the substrate, and the TFT layer may include the ESD protection circuit.

The plurality of pixel circuits may be arranged in an entire area of the substrate at predetermined intervals.

The display module may be one display module from among a plurality of display modules that are consecutively arranged in a display panel, and intervals between pixels arranged in an edge area between a first display module and a second display module adjacent to the first display module among the plurality of display modules may be identical to the predetermined intervals.

The ESD protection circuit may correspond to a predetermined number of pixel circuits from among the plurality of pixel circuits.

The ESD protection circuit may be arranged in a pixel circuit from among the plurality of pixel circuits, the pixel circuit being disposed in an edge area of the display module.

The ESD protection circuit may be connected to at least one from among a scan line, a data line, a power supply line, and a ground line of at least one of the plurality of pixel circuits.

The ESD protection circuit may include an ESD protection circuit of a first type that includes two thin film transistors (TFTs) configured to bypass static electricity flowing through the data line or the power supply line to the ground line.

The ESD protection circuit may include an ESD protection circuit of a second type that includes a transistor configured to cause the scan line, the data line, the power supply line, and the ground line to have equal potentials by a capacitive coupling effect.

The scan line, the data line, and the ground line may be connected to an ESD protection circuit of a first type that includes two thin film transistors (TFTs) configured to bypass static electricity flowing through the data line to the ground line, and the power supply line may be connected to an ESD protection circuit of a second type that includes a transistor configured to cause the scan line, the data line, the power supply line, and the ground line to have equal potentials by a capacitive coupling effect.

According to the above-described various exemplary embodiments, it is possible to protect a display panel from ESD while implementing a bezeless display panel which does not include a bezel region.

DETAILED DESCRIPTION

Figure 1A:
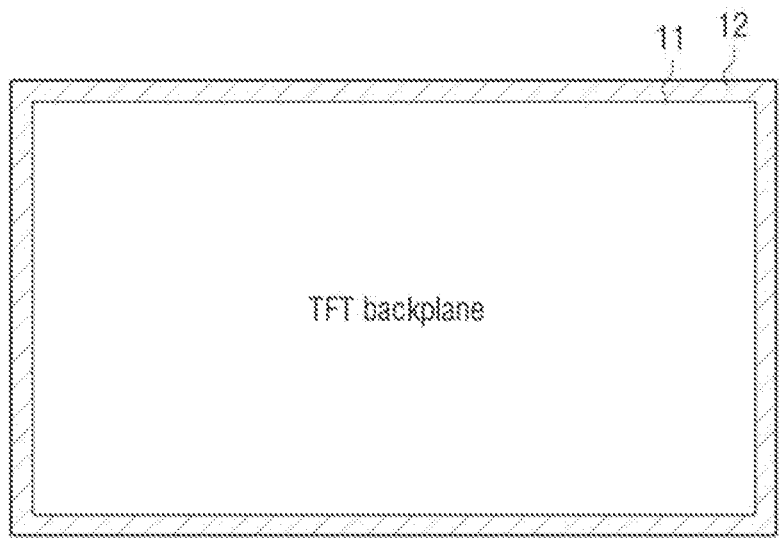
FIG. 1A is a view to explain a problem of an ESD protection circuit of a conventional display panel.

All the terms used in this specification including technical and scientific terms have the same meanings as would be generally understood by those skilled in the related art. However, the meanings of these terms may vary depending on the intentions of the person skilled in the art, legal or technical interpretation, and the emergence of new technologies. In addition, some terms are arbitrarily selected by the applicant. These terms may be construed in the meaning defined herein and, unless otherwise specified, may be construed on the basis of the entire contents of this specification and common technical knowledge in the art.

Embodiments disclosed below may be implemented in various forms and the scope of the disclosure is not limited to the following embodiments. In addition, all changes or modifications derived from the meaning and scope of the claims and their equivalents should be construed as being included within the scope of the disclosure. In the following description, the configuration which is publicly known but irrelevant to the gist of the disclosure may be omitted.

The terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, the components associated with such an ordinal number should not be limited in the order of use, placement order, or the like. If necessary, each ordinal number may be used interchangeably.

The singular expression also includes the plural meaning as long as it does not have a different meaning in context. In this specification, terms such as 'include' and 'have/has' should be construed as designating that there are such features, numbers, operations, elements, components or a combination thereof in the specification, not to exclude the existence or possibility of adding one or more of other features, numbers, operations, elements, components or a combination thereof.

In an embodiment, 'a module', 'a unit', or 'a part' perform at least one function or operation, and may be realized as hardware, such as a processor or integrated circuit, software that is executed by a processor, or a combination thereof. In addition, a plurality of 'modules', a plurality of 'units', or a plurality of 'parts' may be integrated into at least one module or chip and may be realized as at least one processor except for 'modules', 'units' or 'parts' that should be realized in a specific hardware.

Hereinafter, embodiments of the disclosure will be described in detail with reference to the accompanying drawings so that those skilled in the art can easily carry out the disclosure. However, the disclosure may be embodied in many different forms and is not limited to the embodiments described herein. In order to clearly illustrate the disclosure in the drawings, some of the elements that are not essential to the complete understanding of the disclosure are omitted for sharpness, and like reference numerals refer to like elements throughout the specification.

Further, in the embodiment of the disclosure, the display module may be a single independent display panel, or a plurality of display modules may be combined to realize one display panel. When one display module is used as one display panel, the display module has the same meaning as the display panel.

Hereinafter, the disclosure will be described in greater detail with reference to drawings attached herein.

Figure 1B:
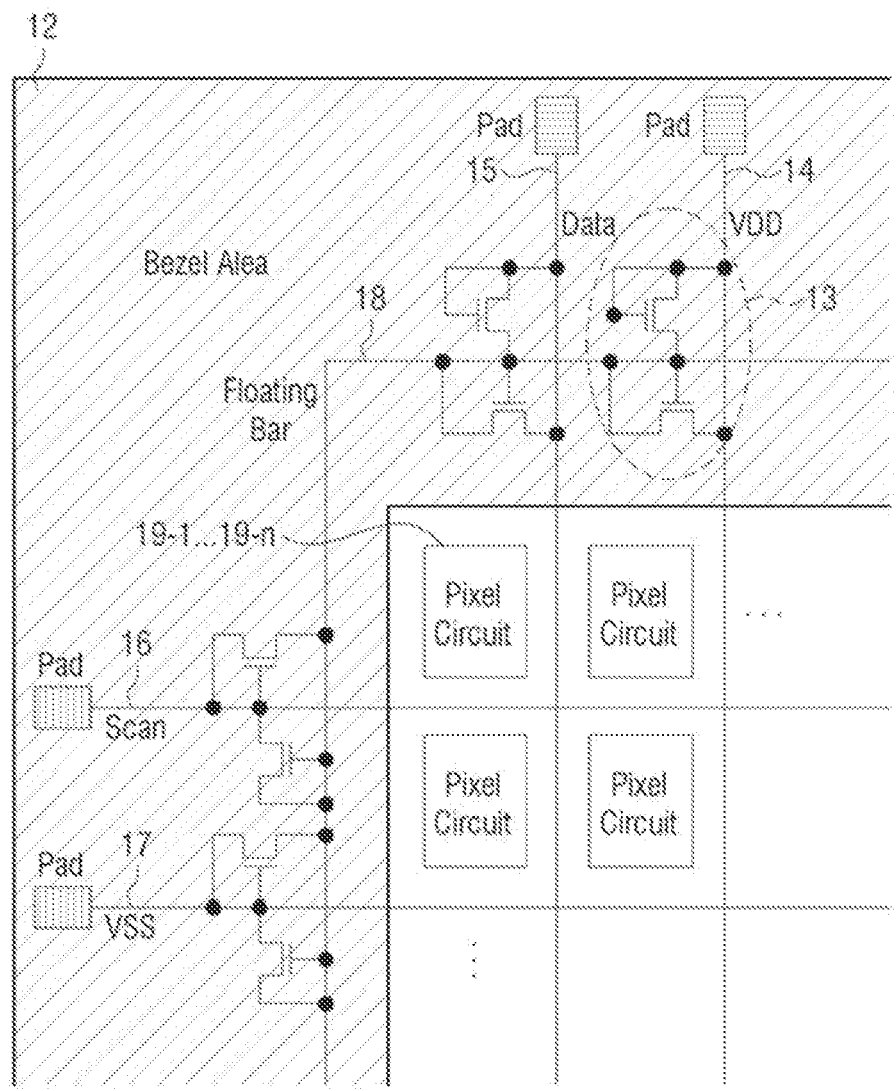
FIG. 1B is a view to explain a problem of an ESD protection circuit of a conventional display panel.

FIGS. 1A and 1B are views to explain a problem of an ESD protection circuit of a conventional display panel.

Referring to FIG. 1A, a display panel may include a backplane 11 that transmits an electrical signal to an element emitting an optical signal, i.e. a light emitting element.

Examples of the conventional backplanes used in display panels that have been mass-produced include a-Si thin film transistor (TFT), Low Temperature Poly Silicon (LTPS) TFT, and an oxide TFT.

For example, a backplane used in an active matrix type display panel using a thin film transistor may have very high static electricity due to a potential difference between a scan line and a data line during a manufacturing process.

Therefore, the above-described various TFT backplanes may include an ESD protection circuit for protecting pixel circuits from static electricity. Generally, the ESD protection circuit may be disposed in an area of a backplane corresponding to a bezel area 12 of a display panel.

The position of the conventional ESD protection circuit is as shown in FIG. 1B.

The display panel may be configured such that a plurality of pixel circuits 19-1 to 19-n are arranged in a matrix formation. The plurality of pixel circuits 19-1 to 19-n may be connected to a power supply line (VDD) 14, a data line 15, a scan line 16, and a ground line (VSS) 17.

A voltage necessary for driving a scan driver (not shown), and a data driver (not shown) included in a driver and a voltage necessary for driving the pixel circuits 19-1 to 19-n may be output through the power supply line 14. The scan driver may apply a scan signal to a display panel through the scan line 16, and the data driver may apply a data signal to a display panel through the data line 15.

The display panel may have a structure comprising signal lines including the data line 15 arranged in a first direction, and the scan line 16 arranged in a second direction crossing the first direction, power source lines including the power supply line (VDD) 14 and the ground line (VSS) 17, and the pixel circuits 19-1 to 19-n in a pixel area where the data line 15 intersects the scan line 16.

Referring to FIG. 1B, the ESD protection circuit 13 may be connected to the power supply line 14, the data line 15, the scan line 16, and the ground line 17 connected to the plurality of pixel circuit 19-1 to 19-in a bezel area outside the plurality of pixel circuits 19-1 to 19-n. The ESD protection circuit 13 may include two TFTs for bypassing static electricity flowing through the data line 15 and the power supply line 14 to the ground line 17. Through the two TFTs and a floating bar 18, lines connected to the plurality of pixel circuits 19-1 to 19-n, and wires constituting the plurality of pixel circuits 19-1 to 19-n may have equal potentials, thereby preventing the occurrence of static electricity.

However, the conventional ESD protection circuit has been a block for realizing a bezel-less display panel since it is disposed in a bezel area outside the plurality of pixel circuits. In addition, when the ESD protection circuit is removed for realizing a bezel-less display panel, a large amount of static electricity may occur during a process of glass scribing, grinding, etc., and a short circuit phenomenon may occur in the unprotected TFT backplane circuit by a leakage of electricity.

Figure 1C:
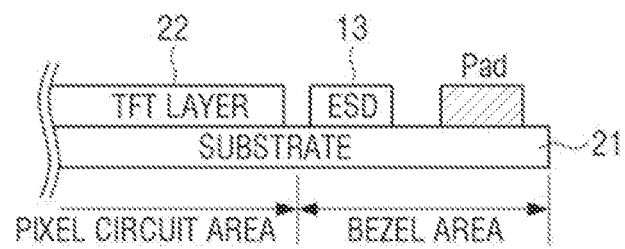
FIG. 1C is a cross-sectional view of a conventional display panel.

FIG. 1C is a cross-sectional view of a conventional display panel. As shown in FIG. 1C, a conventional display panel may have a structure in which a TFT layer 22, an ESD protection circuit 13, and a pad are formed on a substrate 21.

The conventional display panel includes a pixel circuit area corresponding to the TFT layer 22 in which the pixel circuits 19-1 to 19-n described in FIG. 1B are disposed, and a bezel area in which a pixel circuit is not disposed, and the ESD protection circuit 13 may be disposed in the bezel area.

Figure 2A:
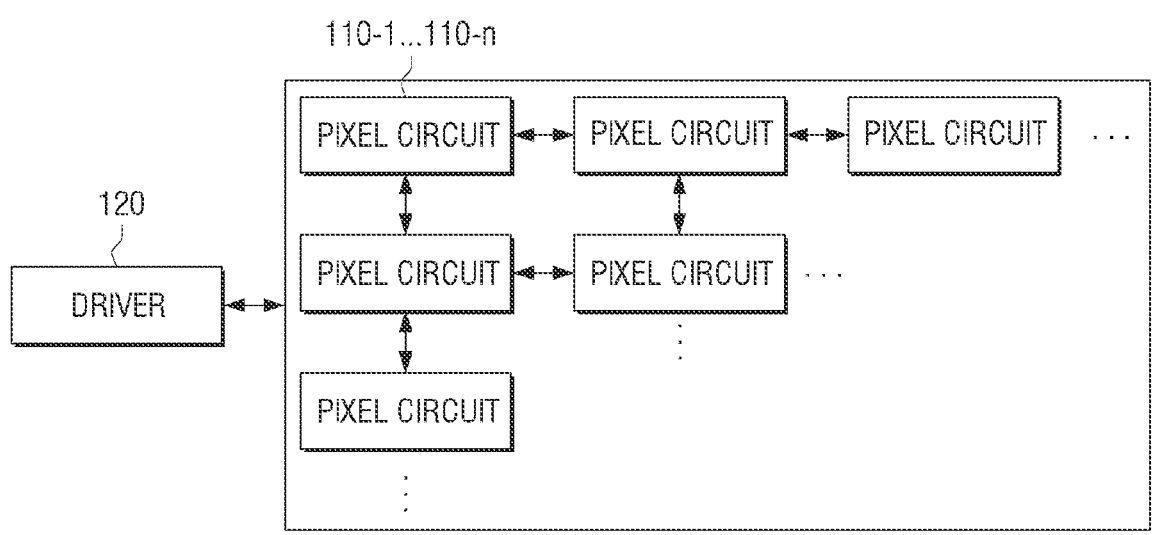
FIG. 2A is a schematic block diagram illustrating configuration of a display module according to an embodiment.

FIG. 2A is a schematic block diagram illustrating configuration of a display module according to an embodiment.

A display apparatus may be an apparatus for converting an electrical signal into an optical signal that can be perceived by the naked eye, including a display module 100 for displaying an image in such a manner.

According to the disclosure, an implementation method of the display module 100 is not particularly limited. For example, the display module 100 may be embodied as various types of display modules such as a liquid crystal display (LCD), an organic light emitting diode (OLED), an active matrix (AM)-OLED, an inorganic light emitting diode, a plasma display panel (PDP), and the like.

For the display module 100, a light emitting element may constitute a pixel or a sub-pixel depending on its implementation method, or additional constituent elements may be further included.

For example, in the case of the OLED or inorganic LED type display module 100, the OLED or the inorganic LED of red (R), green (G), and blue (B) colors, which are light emitting elements, may constitute pixels or sub-pixels of the display module 100. In addition, when the display module 100 is a liquid crystal type, the display module 100 may further include a single color backlight unit (not shown) for supplying light to the liquid crystal. The display module 100 according to an embodiment of the disclosure may include a plurality of pixel circuits 110-1 to 110-n constituting each pixel included in the display module 100, a driver 120 and an ESD protection circuit (not shown) included in at least one of the plurality of pixel circuits 110-1 to 110-n.

The plurality of pixel circuits 110-1 to 110-n may be arranged in a matrix form, and each of the plurality of pixel circuits 110-1 to 110-n may be driven to emit light of a gray scale corresponding to a gray data voltage (e.g., pulse amplitude modulation (PAM)) to which the display module 100 is applied or a pulse width modulation (PWM) data voltage.

The driver 120 may drive the plurality of pixel circuits 110-1 to 110-n and control a light emitting operation of each pixel included in the display module 100.

The driver 120 may include various types of driving circuits for driving the plurality of pixel circuits 110-1 to 110-n such as a data driver (or a source driver), a scan driver (or a gate driver), and the like.

For the display module 100 of the OLED or the inorganic LED type, the OLED or the inorganic LED of R, G, and B may be mounted on the plurality of pixel circuits 110-1 to 110-n to constitute a pixel or a sub-pixel of the display module 100.

The display module 100 of the LCD type may further include a backlight unit for providing single color light, and a color filter or a crystal liquid may be disposed on the plurality of pixel circuits 110-1 to 110-n to constitute the display module 100.

The power source supplier (not shown) may output a voltage necessary for driving the plurality of pixel circuits 110-1 to 110-n according to the driving control of the driver 120.

Figure 2B:
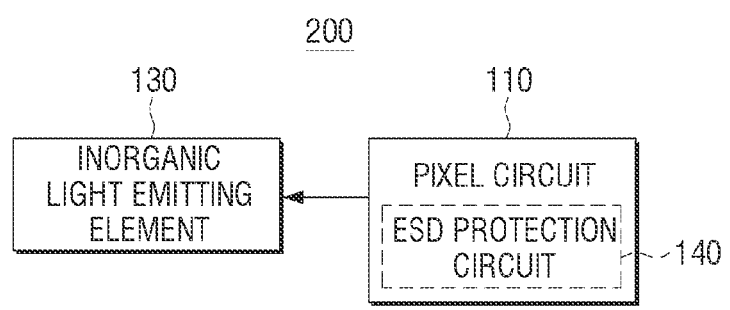
FIG. 2B is a schematic block diagram illustrating configuration of a display module in inorganic LED method according to an embodiment.

As illustrated in FIG. 2B, the ESD protection circuit may be included in at least one of the plurality of pixel circuits 110-1 to 110-n and may protect the pixel circuit from ESD. The ESD protection circuit may be embodied as an ESD protection circuit of a first type including two thin film transistors (TFTs) for bypassing the static electricity flowing through the data line or the power supply line of the pixel circuit to the ground line.

The ESD protection circuit may be embodied as an ESD protection circuit of a second type including a transistor to allow the scan line, the data line, the power supply line and the ground line of the pixel circuit to have equal potentials due to a capacitive coupling effect.

The detailed configuration of the ESD protection circuit will be described in detail with reference to FIG. 3.

FIG. 2A shows an example in which the driver 120 is included in the display module 100, but the disclosure is not limited thereto. The driver 120 may not be included in the display module 100, but may be additionally provided.

FIG. 2B is a schematic block diagram illustrating configuration of a display module of the inorganic LED type according to an embodiment of the disclosure. According to FIG. 2B, a display module 200 may include an inorganic light emitting element 130 and a pixel circuit 110.

For ease of explanation, FIG. 2B illustrates the configuration relating to one pixel included in the display module 200. However, the display module 200 may include a plurality of pixels, and each pixel (specifically, each sub-pixel) may include an inorganic light emitting element 130 and a pixel circuit 110, and thus the display module 200 may include the inorganic light emitting element 130 and a plurality of pixel circuits 110 corresponding to the inorganic light emitting element 130.

According to an embodiment of the disclosure, the ESD protection circuit 140 may be arranged in at least one of the plurality of pixel circuits 110-1 to 110-n. Therefore, some of the plurality of pixel circuits 110-1 to 110-n may include the ESD protection circuit 140 and some may not include the ESD protection circuit 140. Therefore, the ESD protection circuit 140 are shown in dotted line in FIG. 2B.

The inorganic light emitting element 130 may constitute a pixel (specifically, a sub-pixel) of the display module 200, and emit light according to the driving of the pixel circuit 110.

The inorganic light emitting element 130 may have various types depending on the color of emitted light. For example, the inorganic light emitting element 130 may include a red (R) light emitting element for emitting light of a red color, a green (G) light emitting element for emitting light of a green color, and a blue (B) light emitting element for emitting light of a blue color.

The type of sub-pixel constituting one pixel of the display module 200 may be identified based on the type of inorganic light emitting element 130. In other words, the R light emitting element may constitute an R sub-pixel, the G light emitting element may constitute a G sub-pixel, and the B light emitting element may constitute a B sub-pixel.

The inorganic light emitting element 130 may be a light emitting element formed of an inorganic material, which is different from an Organic Light Emitting Diode (OLED) formed of an organic material.

According to an embodiment of the disclosure, the inorganic light emitting element may be a micro light emitting diode (LED). The micro LED may be a ultra-mini inorganic light emitting element with a size of less than 100 μm that emits light by itself without a backlight and a color filter.

The pixel circuit 110 may drive the inorganic light emitting element 130. To be specific, when a grayscale data voltage is applied, the pixel circuit 110 may provide a driving current corresponding to the applied grayscale data voltage and drive the inorganic light emitting element 130.

To be specific, according to an embodiment, the pixel circuit 110 may drive the inorganic light emitting element 130 through pulse amplitude modulation (PAM) and/or pulse width modulation (PWM). The pixel circuit 110 may control an amplitude and/or a pulse width of a driving current that drives the inorganic light emitting element 130 according to the applied grayscale data voltage, and provide the driving current of which the amplitude and/or the pulse width is controlled to the inorganic light emitting element 130.

The pixel circuit 110 may be provided in each inorganic light emitting element 130, and unlike a liquid crystal display (LCD) panel that uses a light emitting element with a single color as a backlight, may drive the inorganic light emitting element 130 and exhibit a grayscale in a unit of a sub-pixel.

The ESD protection circuit 140 may be included in the pixel circuit 110. According to an embodiment, the ESD protection circuit 140 may be included or arranged in the pixel circuit 110 (or the pixel circuit 110 area), and thus unlike a conventional display panel having an ESD protection circuit in a separate bezel area 12, a complete bezel-less panel may be constructed. Particularly, the micro LED may be most suitable for constructing a bezel-less module or a bezel-less panel due to its small size, but the disclosure is not limited thereto.

Figure 2C:
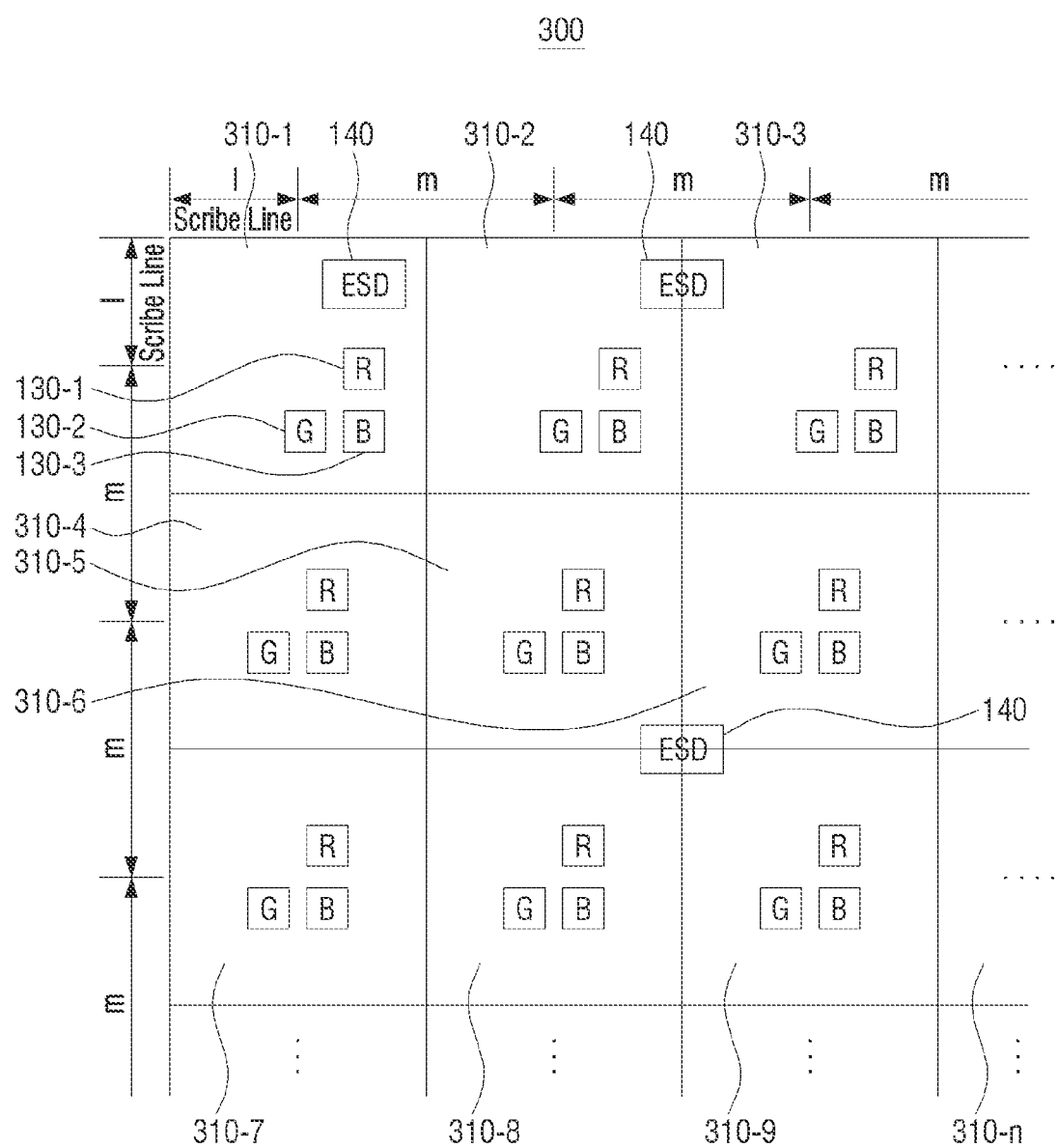
FIG. 2C is a view illustrating a pixel structure of a display module according to an embodiment.

FIG. 2C is a view illustrating a pixel structure of a display module according to an embodiment of the disclosure. As shown in FIG. 2C, a display module 300 may include a plurality of pixel areas 310-1 to 310-n arranged in a matrix form. The plurality of pixel areas 310-1 to 310-n may be arranged in an entire area of the display module 300 including an edge area at a predetermined interval (m).

Each of the plurality of pixel areas 310-1 to 310-n may include a pixel circuit corresponding thereto. Therefore, the pixel area may be referred to as a pixel circuit area. Referring to an embodiment of FIG. 2C, one pixel area may include three inorganic light emitting elements 130-1 to 130-3 such as red (R), green (G) and blue (B). Therefore, each pixel area may include three pixel circuits respectively corresponding to three inorganic light emitting elements R, G and B.

However, the disclosure is not limited thereto. For example, the display module may include a plurality of sub-pixel areas arranged in a matrix format, and in this case, each sub-pixel area may include one inorganic light emitting element and one pixel circuit corresponding thereto.

According to an embodiment of the disclosure, the ESD protection circuit 140 may be arranged in a pixel circuit.

Referring to FIG. 2C, the display module 300 may not include a bezel area unlike the display panel in FIG. 1B.

Therefore, ESD protection circuit 140 may be arranged, for example, in a pixel circuit in various positions of the plurality of pixel areas 310-1 to 310-n as shown in FIG. 2C.

To be specific, the ESD protection circuit 140 may be arranged in a pixel circuit included in one pixel area 310-1, or in pixel circuits included in two pixel areas 310-2 and 310-3 according to an embodiment.

The ESD protection circuit 140 may be arranged in at least one pixel circuit of pixel circuits included in a pixel area disposed in an edge area (or an outer area) of the display module 300, but is not limited thereto. As shown in FIG. 2C, the ESD protection circuit 140 may be arranged in the pixel circuits included in pixel areas 310-5, 310-6, 310-8 and 310-9 at an internal portion of the display module 300 rather than on an outside edge of the display module 300.

Referring to FIG. 2C, the inorganic light emitting elements 130-1 to 130-3 may be micro LEDs. In this case, the micro LED may have a very small size. Therefore, the display module 300 may be formed such that a distance (1) between pixel areas from a scribe line to a first line may be smaller than a distance (m) between the pixel areas 310-1 to 310-n.

Therefore, according to an embodiment, a display module capable of ESD protection without a bezel area may be provided.

Referring to FIG. 2C, R, G and B sub-pixels may be arranged in a left and right reversed L shape. However, the disclosure is not limited thereto, and the R, G and B sub-pixels may be arranged in a line in a pixel area. However, such arrangement form of sub-pixels is merely descriptive, and a plurality of sub-pixels may be arranged in various forms in each pixel.

According to the above-described example, it is described that one pixel consists of three types of sub-pixels, but is not limited thereto. For example, a pixel may consist of four types of sub-pixel such as R, G, B and white (W), and according to an embodiment, the number of sub-pixels to form one pixel is not limited.

Figure 2D:
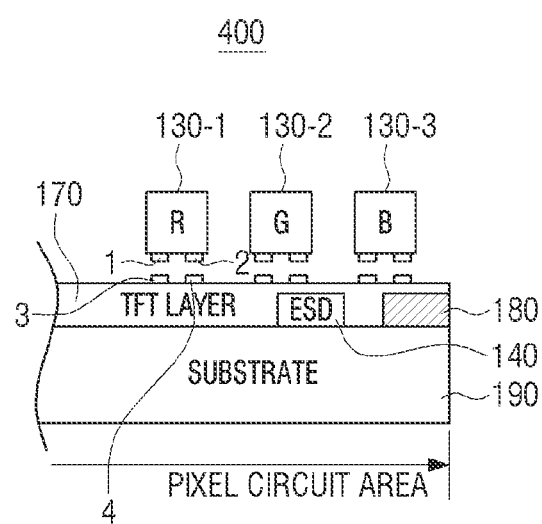
FIG. 2D is a cross-sectional view illustrating a display module according to an embodiment.

FIG. 2D is a cross-sectional view illustrating a display module according to an embodiment of the disclosure. For ease of explanation, FIG. 2D illustrates one pixel included in the display module 400.

Referring to FIG. 2D, a display module 400 may include a thin film transistor (TFT) layer 170 formed on a substrate 190 and inorganic light emitting elements 130-1 to 130-3 mounted on the TFT layer 170.

The TFT layer 170 may be formed on an entire area of the substrate 190, and the plurality of pixel circuits 110-1 to 110-n may be formed on the TFT layer 170 in a matrix form. The plurality of pixel circuits 110-1 to 110-n may be arranged in an entire area of the substrate 190 including an edge area at a predetermined interval.

Although not explicitly shown, on the TFT layer 170, a pixel circuit 110 for driving each of the inorganic light emitting elements 130-1 to 130-3 may be provided for each of the inorganic light emitting elements 130-1 to 130-3. Therefore, each of the inorganic light emitting elements R, G and B 130-1 to 130-3 may be mounted or arranged on the pixel circuit 110 to be electrically connected to the pixel circuit 110 corresponding thereto.

Referring to FIG. 2D, the R light emitting element 130-1 may be mounted or arranged so that an anode electrode 1 and a cathode electrode 2 of the R light emitting element 130-1 may be respectively connected to an anode electrode 3 and a cathode electrode 4 formed on the pixel circuit 110 corresponding to the R light emitting element 130-1, and the G light emitting element 130-2 and the B light emitting element 130-3 may be mounted or arranged in the same manner. According to an embodiment, one of the anode electrode 3 and the cathode electrode 4 may be embodied as a common electrode.

Unlike a conventional technique of FIG. 1C, the display module 400 of FIG. 2D may have a pixel circuit area, but may not have a bezel area. Therefore, according to an embodiment, the ESD protection circuit 140 and a pad 180 may be formed in the TFT layer 170.

The pad 180 may transmit signals transmitted from the driver (not shown) or the power source supplier (not shown) to the pixel circuits included in the TFT layer 170.

The substrate 190 may be formed of various materials. For example, the substrate 190 may be formed of glass or synthetic resin. In the example of FIG. 2D, the substrate 190 may be a flat substrate. In this case, the substrate 190 may be formed of a hard material rather than a flexible material.

Referring to FIG. 2D, a micro LED of flip chip type is exemplified as inorganic light emitting elements 130-1 to 130-3. However, the disclosure is not limited thereto, and the inorganic light emitting elements 130-1 to 130-3 may be a micro LED of lateral type or vertical type.

Figure 2E:
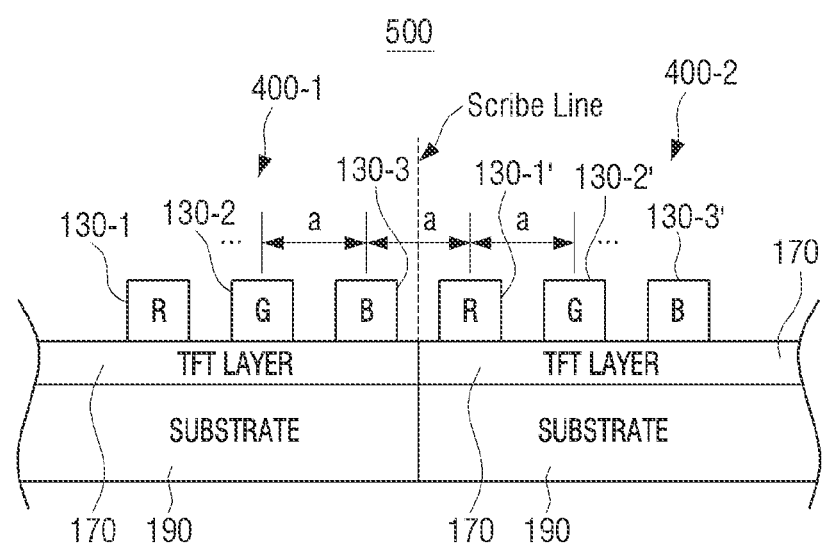
FIG. 2E is an exemplary view illustrating a display panel including a plurality of display modules in FIG. 2D according to an embodiment.

FIG. 2E is an exemplary view showing that a display panel may be configured with a plurality of display modules of FIG. 2D.

According to an embodiment, a display module 100, 200, 300 and 400 may constitute a display panel. In addition, according to another embodiment, a single display panel may be embodied with a consecutive arrangement of a plurality of display modules. FIG. 2E illustrates an example embodiment in which a display module 400 is arranged.

As described above, the display module 400 may not have a bezel area, particularly, when the inorganic light emitting element is a micro LED, the size thereof may be very small. Therefore, as shown in FIG. 2E, the display module may be arranged or combined so that a length (a) between the inorganic light emitting element 130-3 closest to a scribe line of a display module 400-1 and an inorganic light emitting element 130-1' closest to a scribe line of a display module 400-2 may be identical to a length (a) between the inorganic light emitting elements 130-1 to 130-3, and 130-1' to 130-3' of the display modules 400-1 and 400-2. Here, the "identical" includes the case where there is a certain margin of errors (e.g., less than 30%).

Therefore, according to an embodiment, even when one display panel is configured with the combination of the plurality of display modules 400-1 and 400-2, a display panel can provide a complete seamless image without a phenomenon in which an image is cut off at the boundary where the display modules are combined.

According to various embodiments of the disclosure, the term 'bezel-less' encompasses the case where a bezel exists during a process of manufacturing a display panel but is removed after the process. Such example embodiment will be described through FIGS. 2F and 2G.

Figure 2F:
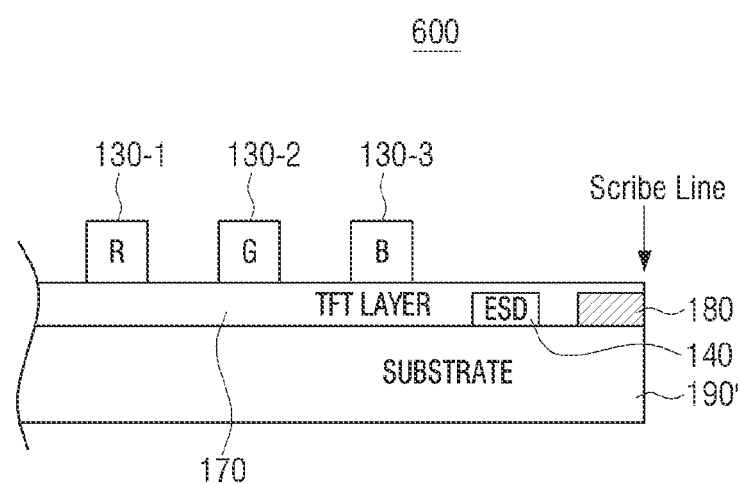
FIG. 2F is a cross-sectional view illustrating a display module according to another embodiment.

A display module 600 of FIG. 2F may be similar to the display module 400 of FIG. 2D in that the ESD protection circuit 140 and the pad 180 are arranged in the TFT layer 170, but the arrangement positions may be different. In other words, unlike the display module 400 of FIG. 2D, in the display module 600 of FIG. 2F, a pixel circuit for driving the inorganic light emitting elements 130-1 to 130-3 may not be arranged in a certain area of the TFT layer 170 based on a scribe line, and the inorganic light emitting elements 130-1 to 130-3 may not be mounted in that area.

In the example of FIG. 2F, a substrate 190' of the display module 600 may be formed of a flexible material.

In this case, a display panel without a bezel area may be embodied by bending and fixing the outer area of the display module 600 in the direction of the substrate 190'.

Figure 2G:
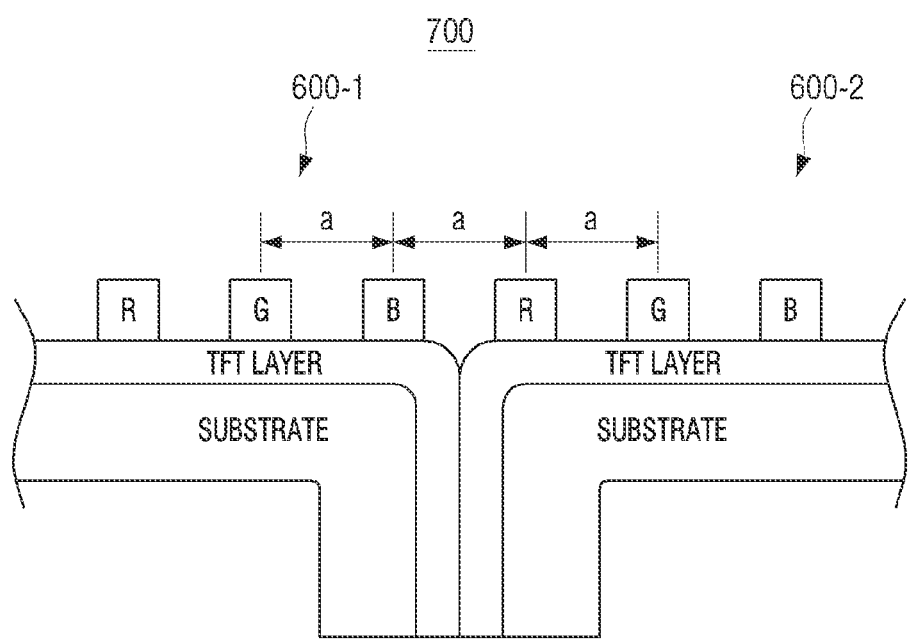
FIG. 2G is an exemplary view illustrating a display panel including a plurality of display modules in FIG. 2F according to an embodiment.

FIG. 2G illustrates an example embodiment in which a plurality of display modules 600 of FIG. 2F are combined to form a display panel. As shown in FIG. 2G, the display module 600-1 and 600-2 may be bent in the direction of the substrate 190' to be coupled to each other, and a display panel can provide a complete seamless image without a phenomenon in which an image is cut off at the boundary where the display modules are combined.

Although not shown, when a single display panel is formed by using one display module 600, a bezel-less display may be embodied by bending and fixing each outer area of the display module 600 in the direction of the substrate 190'.

Figure 2H:
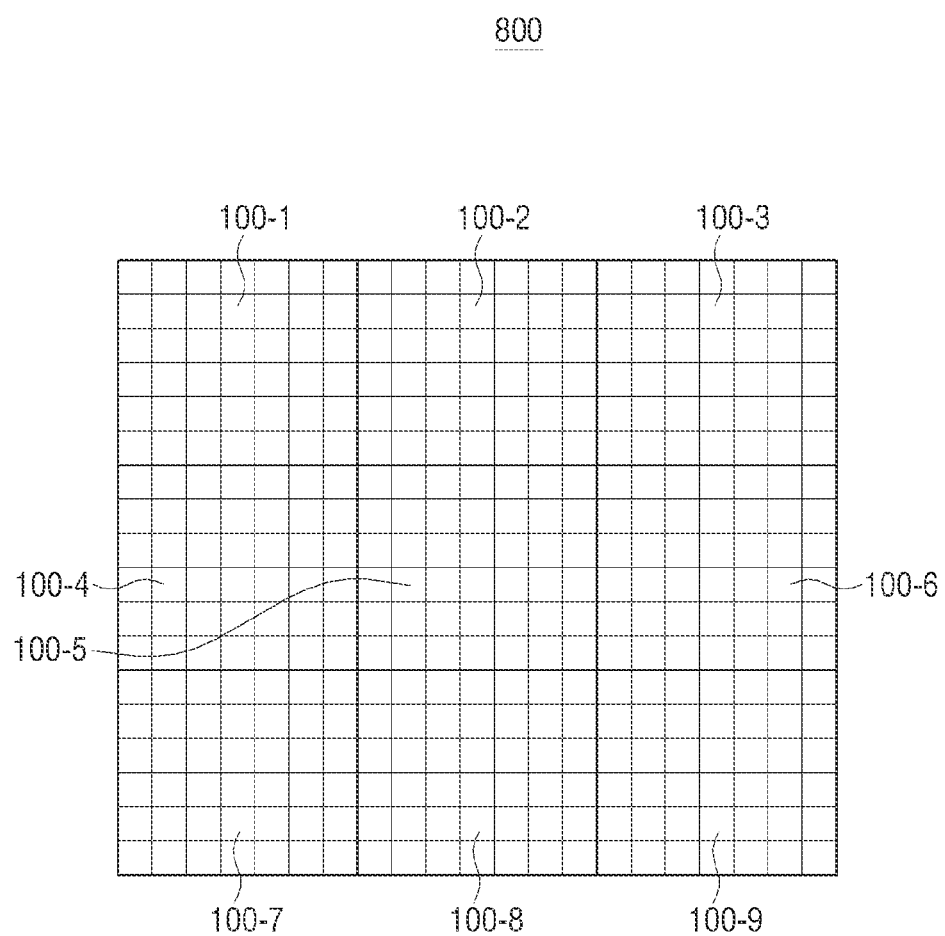
FIG. 2H is an exemplary view illustrating a display panel in which a plurality of modules are connected according to an embodiment.

FIG. 2H is an exemplary view illustrating a display panel in which a plurality of display modules are connected. According to an embodiment of the disclosure, as shown in FIG. 2H, nine of display modules 100-1 to 100-9 may be consecutively disposed to form one bezel-less display panel 800.

FIG. 2H shows an example in which the display module 100 has an arrangement of 3×3, but is not limited thereto. The number and formation of display modules are not limited to form a bezel-less display panel.

The other display modules 200, 300, 400 and 600 described above may be formed in the same manner.

Figure 2I:
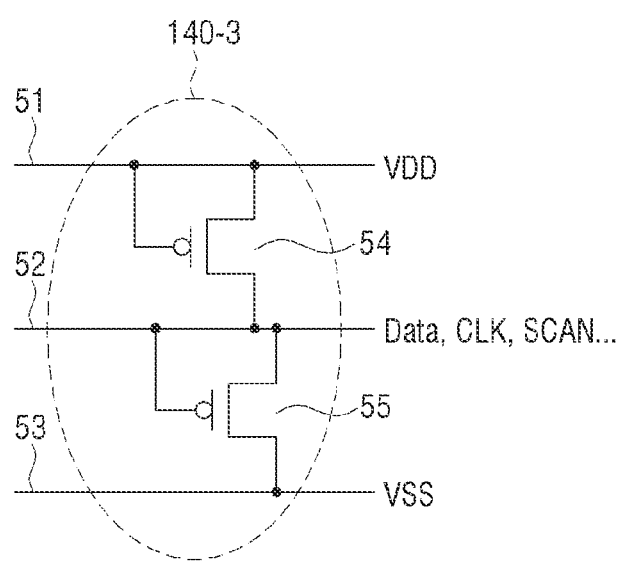
FIG. 2I is an exemplary view illustrating an ESD protection circuit according to an embodiment.

FIG. 2I is a view illustrating a connection relationship of an ESD protection circuit according to an embodiment. The ESD protection circuit 140-3 shown in the example of FIG. 2I may be an ESD protection circuit included in a p-type LTPS backplane.

In the backplane constituting the display modules 100, 200, 300, 400 and 600, a driving voltage (VDD) wiring line 51 for driving each pixel circuit, a ground (VSS) voltage wiring line 53, and various swing voltage (data, clock, scan signals, etc.) wiring lines 52 may be provided in each pixel circuit. For ease of illustration, FIG. 2I illustrates only one swing voltage wiring line 52, but it could be easily understood that an additional wiring line may be provided for each type of swing voltage.

Referring to FIG. 2I, an ESD protection circuit 140-3 may include a first-type metal oxide semiconductor field effect transistor (PMOSFET) 54 in which a gate terminal and a source terminal area connected to a driving voltage wiring line 51, and a drain terminal is connected to a swing voltage wiring line 52, and a second PMOSFET 55 in which a gate terminal and a source terminal are connected to the swing voltage wiring line 52 and a drain terminal is connected to the ground voltage wiring line 53.

The ESD protection circuit 140-3 may be included in at least one pixel circuit among a plurality of pixel circuits constituting the display modules 100, 200, 300, 400 and 600.

However, the type and connection relationship of the ESD protection circuit 140 is not limited to FIG. 2I. Hereinafter, the detailed configuration of an ESD protection circuit according to various embodiments of the disclosure will be described. The detailed connection manner of the ESD protection circuit will be shown with reference to FIGS. 3 to 5. The connection method of the ESD protection circuit is not limited to FIGS. 3 to 5.

Figure 3:
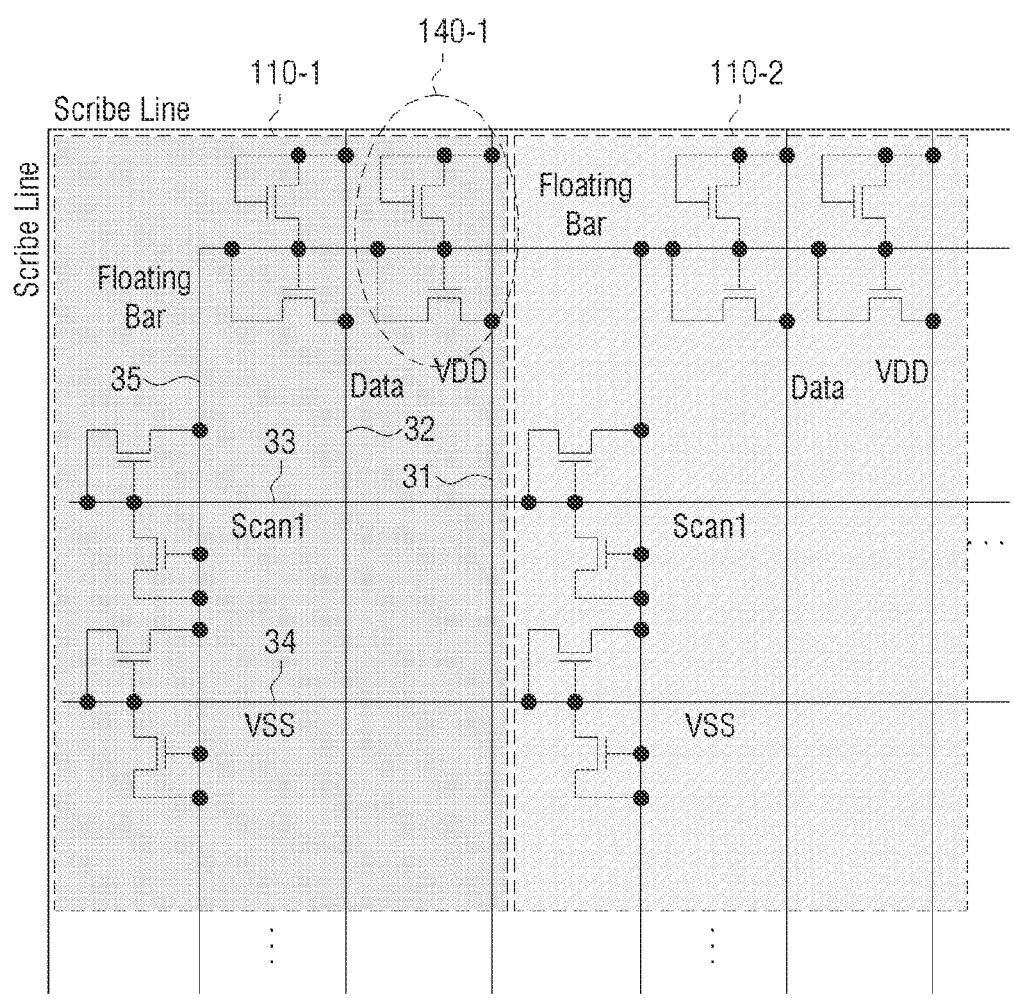
FIG. 3 is a view to explain an ESD protection circuit of a display panel according to an embodiment.

Referring to FIG. 3, an ESD protection circuit 140-1 may be connected to a power supply line 31, a data line 32, a scan line 33, and a ground line 34 in the pixel circuits 110-1 to 110-n. Referring to FIG. 3, the ESD protection circuit 140-1 may be embodied as the ESD protection circuit of a first type.

One end of the ESD protection circuit of first type 140-1 may be connected to the data line 32 or the scan line 33, and the other end may be connected to the ground line 34.

To be specific, two TFTs included in the ESD protection circuit of first type 140-1 may have a source terminal connected to the floating bar 35, and a drain terminal connected to one of the power supply line 31, the data line 32, the scan line 33, and the ground line 34. The gate terminal of the TFT may be connected to the floating bar 35, or one of the power supply line 31, the data line 32, the scan line 33 and the ground line 34.

Accordingly, the static electricity generated by the display module 100, 200, 300, 400, and 600 may be emitted to the outside of the display module 100, 200, 300, 400, and 600 through the ground line 34 connected to the other end of the first ESD protection circuit 140-1.

As described above, the first ESD protection circuit 140-1 may be arranged in the pixel circuits 110-1 to 110-n in the same manner.

However, a DC high voltage instead of a swing voltage may be applied to the power supply line 31 and the data line 32, which are used in a micro-LED display, and thus, a large amount of leakage currents may occur when the ESD protection circuit of the first type 140-1 is used.

Figure 4:
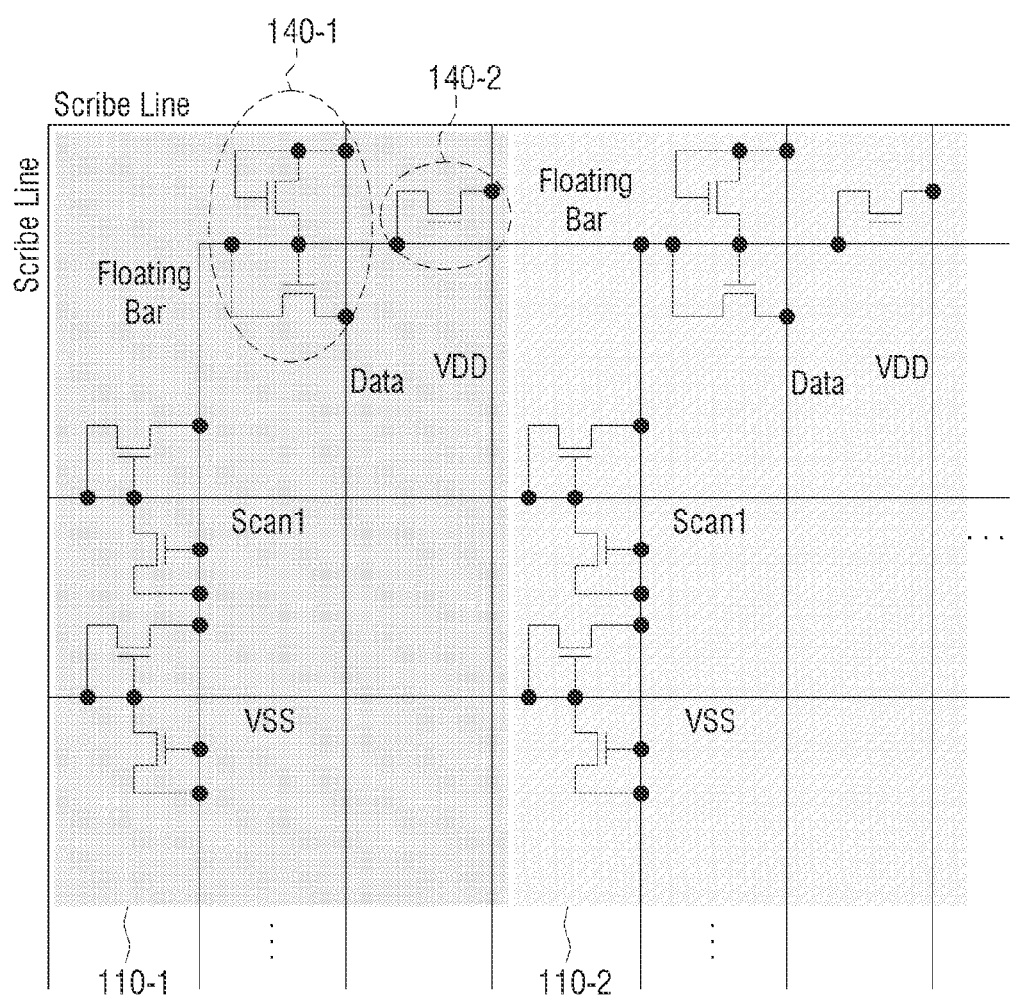
FIG. 4 is a view to explain an ESD protection circuit of a display panel according to an embodiment.

Therefore, referring to FIG. 4, an ESD protection circuit of a second type 140-2 including a transistor that allows the power supply line 31, the data line 32, the scan line 33, and the ground line 34 to have equal potentials by the capacitive coupling effect may be connected to the power supply line 31 to which the DC high voltage is applied.

The transistor may be embodied as a floating gate type TFT, and both ends of the TFT may be connected to the power supply line 31 and the floating bar 35, respectively. When an electrostatic voltage is applied to the floating bar 35, the electrostatic voltage may be transmitted to all wires connected to the plurality of pixel circuits 110-1 to 110-n by the capacitive coupling effect to allow all the wires in the TFT backplane to maintain the equal potential.

Figure 5:
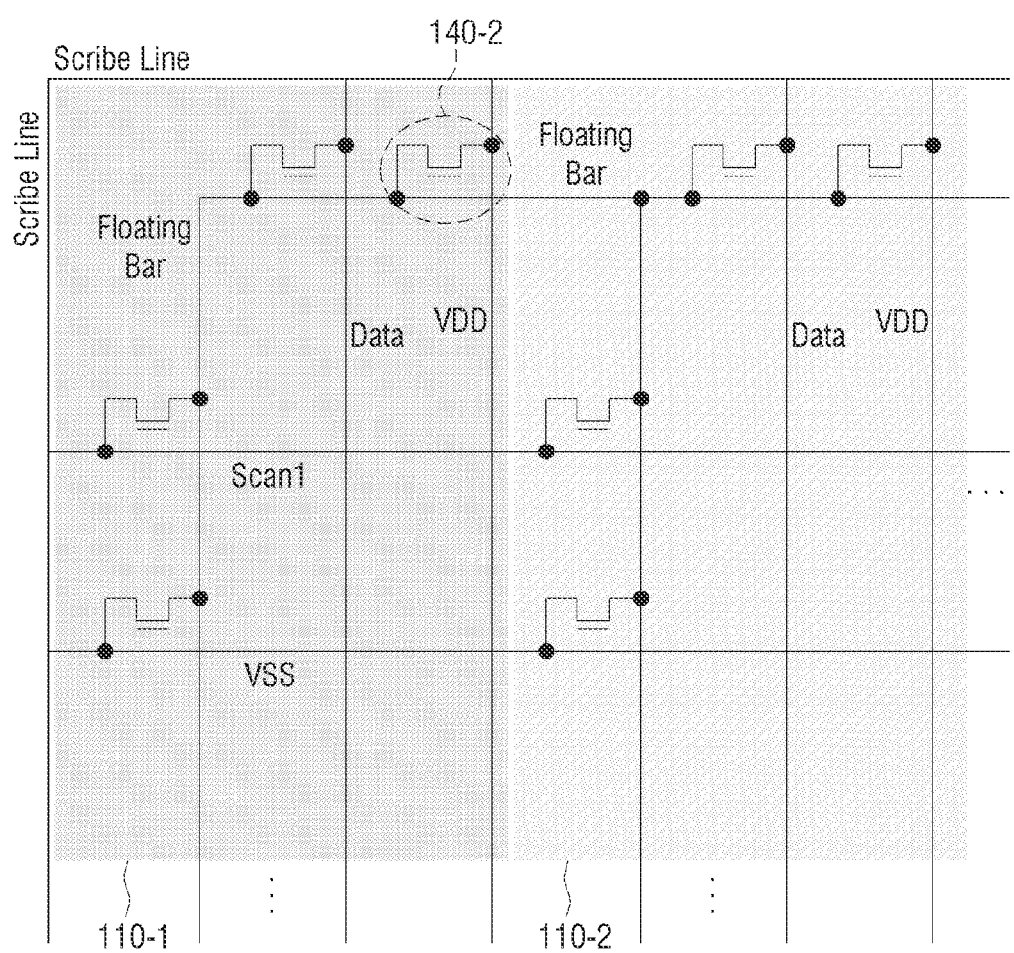
FIG. 5 is a view to explain an ESD protection circuit of a display panel according to an embodiment.

However, referring to FIG. 5, all ESD protection circuits included in the plurality of pixel circuits 110-1 to 110-n may be embodied as the ESD protection circuit of the second type 140-2. In other words, the ESD protection circuit included in the plurality of pixel circuits 110-1 to 110-n may be embodied either as the ESD protection circuit of the first type 140-1 or the ESD protection circuit of the second type 140-2.

The ESD protection circuit 140 may be arranged in a unit of a pixel circuit of a predetermined number in the display module 100 and 200.

Figure 6:
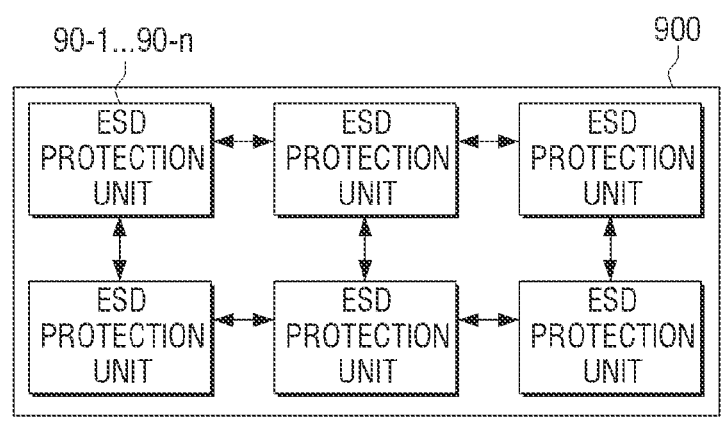
FIG. 6 is a schematic block diagram illustrating configuration of an ESD protection unit of a display panel according to an embodiment.

FIG. 6 is a schematic block diagram illustrating configuration of an ESD protection unit of a display module or a display panel according to an embodiment.

A display module 900 according to an embodiment may have a structure in which a plurality of ESD protection units 90-1 to 90-n having a predetermined number of pixel circuits as one unit are repeatedly connected and arranged, and each of the plurality of ESD protection units 90-1 to 90-n may include at least one ESD protection circuit 140.

For example, each of the plurality of ESD protection units 90-1 to 90-n may include pixel circuits constituting a pixel of 190×120, and at least one ESD protection circuit 140 may be included in each of the pixel circuits. When the display module 900 has a resolution of 1900×1200, the display module 900 may therefore include 10 (ten) ESD protection units.

Figure 7:
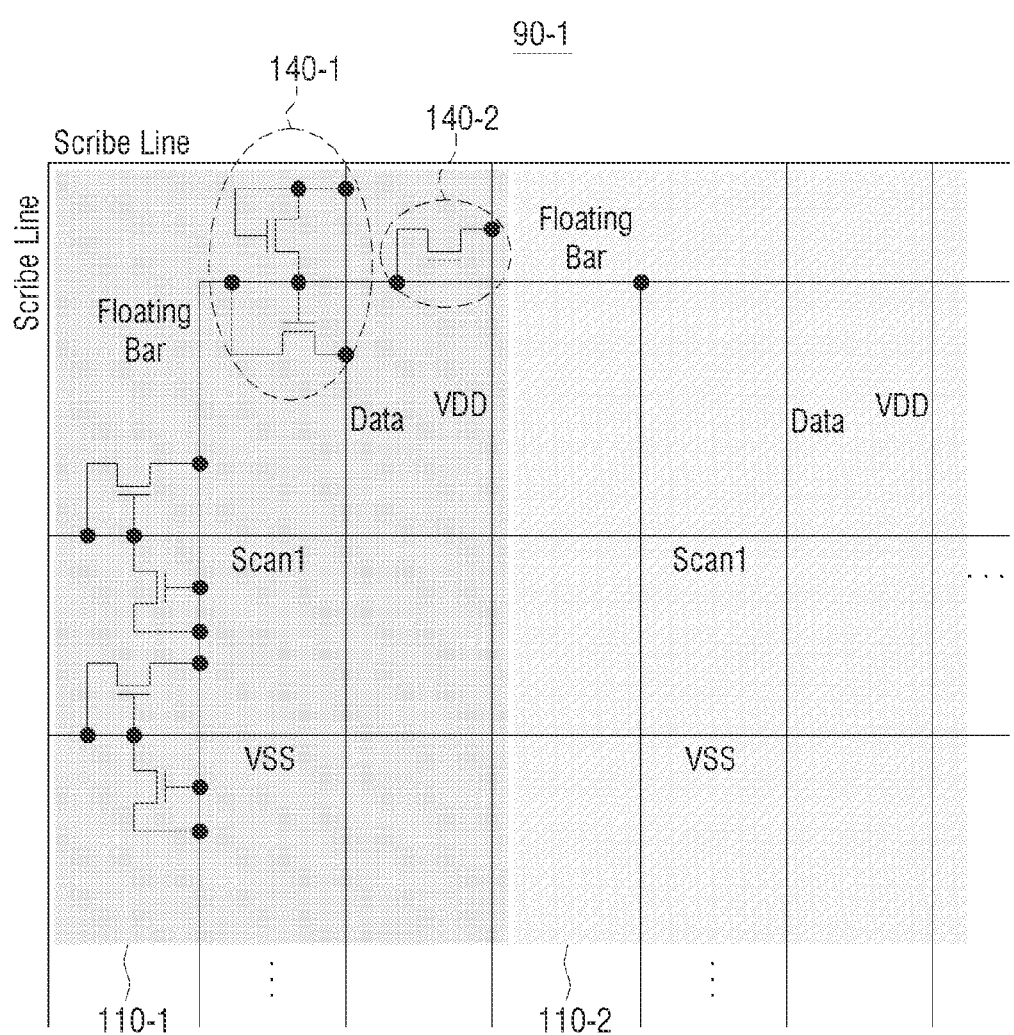
FIG. 7 is a view to explain an ESD protection circuit of a display panel according to an embodiment.

Referring to FIG. 7, the ESD protection circuits 140-1 and 140-2 may be connected only to the power supply line 31, the data line 32, the scan line 33, and the ground line 34 of the first pixel circuit 110-1 of the plurality of pixel circuits included in the ESD protection circuit 90-1. In other words, all the pixel circuits included in the ESD protection unit 90-1 may share the ESD protection circuits 140-1 and 140-2 connected to the first pixel circuit 110-1.

Figure 8:
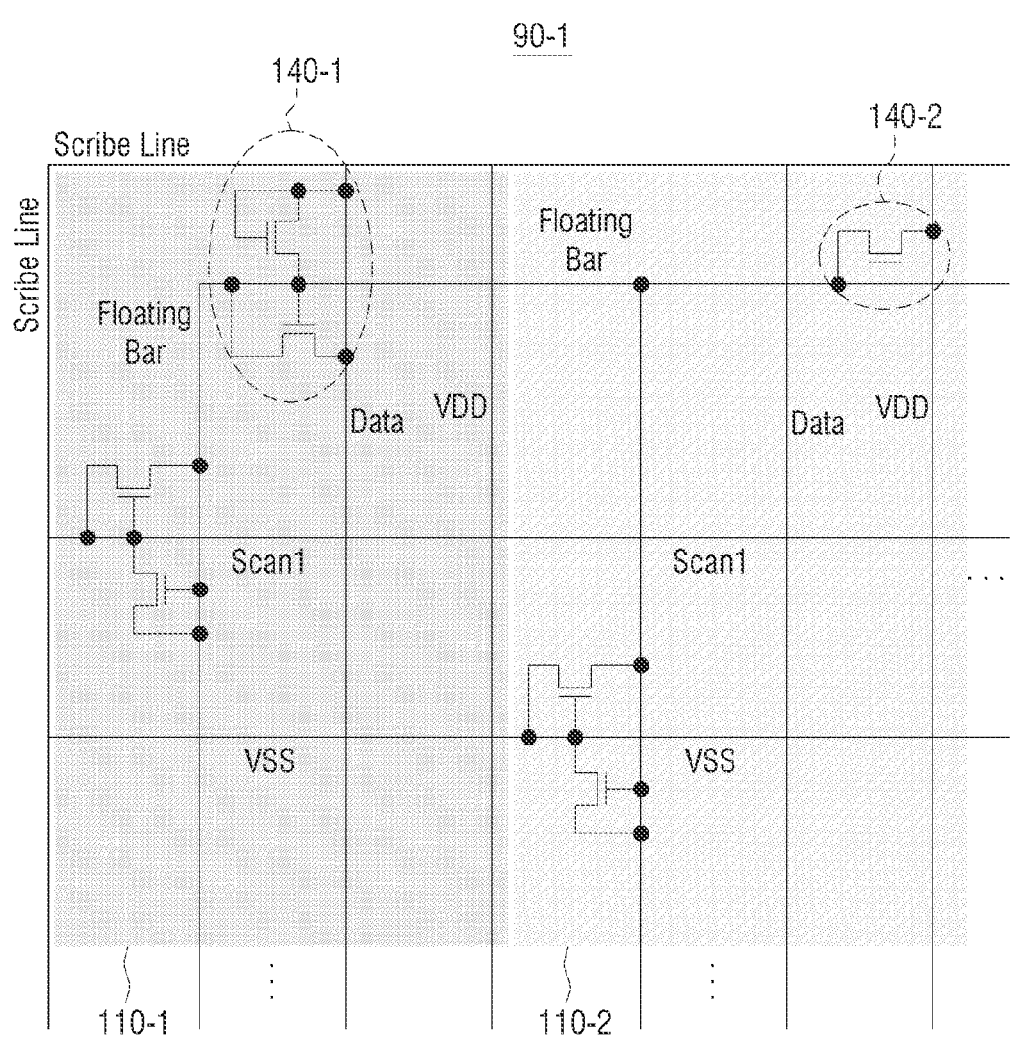
FIG. 8 is a view to explain an ESD protection circuit of a display panel according to an embodiment.

Referring to FIG. 8, the ESD protection circuits 140-1 and 140-2 may be respectively arranged in the first pixel circuit 110-1 and the second pixel circuit 110-2 in the ESD protection unit 90-1.

In this case, all the pixel circuits included in the ESD protection unit 90-1 may share the ESD protection circuit 140-1 connected to the first pixel circuit 110-1 and the ESD protection circuit 140-2 connected to the second pixel circuit 110-2.

However, the disclosure is not limited to FIGS. 7 and 8.

Figure 9:
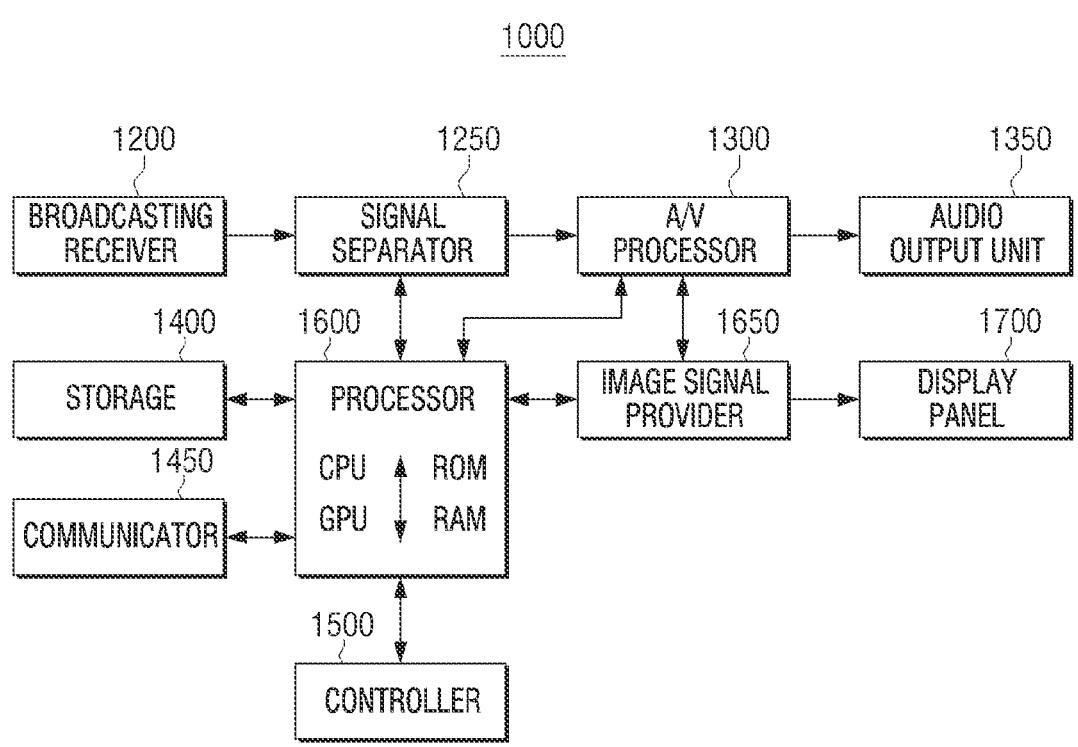
FIG. 9 is a block diagram illustrating configuration of a display apparatus including a display panel according to an embodiment.

FIG. 9 is a block diagram illustrating configuration of a display apparatus including a display panel according to an embodiment of the disclosure.

Referring to FIG. 9, a display apparatus 1000 according to an embodiment may include a display panel 1700, a broadcasting receiver 1200, a signal separator 1250, an A/V processor 1300, an audio output unit 1350, a storage 1400, a communicator 1450, a controller 1500, a processor 1600, and an image signal provider 1650.

The broadcasting receiver 1200 may receive broadcasting by wire or wirelessly from a broadcasting station or satellite and demodulate the broadcasting. To be specific, the broadcasting receiver 1200 may receive a transport stream through an antenna or a cable, demodulate the transport stream, and output a digital transport stream signal (specifically, a clock signal (TS_CLK), a sync signal (TS_SYNC), a valid signal (TS_VALID), and 8 data signals (TS_DATA [7:0])). In addition, the broadcasting receiver 1200 may receive broadcasting signals from an external device (e.g., a set-top box).

The signal separator 1250 may separate the transport stream signals provided from the broadcasting receiver 1200 into an image signal, an audio signal, and an additional information signal. The signal separator 1250 may transmit image signals and audio signals to the A/V processor 1300.

The A/V processor 1300 may perform signal processing such as video decoding, video scaling, audio decoding, or the like on image signals and audio signals input from the broadcasting receiver 1200 and the storage 1400. The A/V processor 1300 may output image signals to the image signal provider 1650, and audio signals to the audio output unit 1350.

When the received images and audio signals are stored in the storage 1400, the A/V processor 1300 may output images and videos to the storage 1400 in a compressed form.

The audio output unit 1350 may convert audio signals output from the A/V processor 1300 into sound and output the sound through a speaker (not shown), or output the sound to an external device connected through an external output terminal (not shown).

The image signal provider 1650 may generate a graphic user interface (GUI) for providing to a user. The image signal provider 1650 may add the generated GUI to the image output from the A/V processor 1300. The image signal provider 1650 may provide an image signal corresponding to the image to which the GUI is added to the display module 100. Accordingly, the display module 100 may display various information provided by the display apparatus 1000 and the image transmitted from the image signal provider 1650.

The image signal provider 1650 may extract bright information corresponding to the image signal, and generate a dimming signal corresponding to the extracted brightness information. The image signal provider 1650 may provide the generated dimming signal to the display panel 1700. The dimming signal may be a PWM signal. According to an embodiment, a dimming signal may be provided from the image signal provider 1650 and provided to the display panel 1700, but at the time of implementation, the display panel 1700 that receives an image signal may generate a dimming signal by itself for use.

The display panel 1700 may display an image. The display panel 1700 may be implemented as various types of displays such as a light emitting diode (LED), a liquid crystal display (LCD), an organic light emitting diode (OLED) display, and a plasma display panel (PDP). The display panel 1700 may further include a driving circuit, which may be implemented in the form of an a-Si TFT, a low temperature poly silicon (LTPS) TFT, an organic TFT (OTFT), etc., a backlight unit, and the like. Meanwhile, the display panel 1700 may be implemented as a touch screen in combination with a touch sensing unit.

When the display panel 1700 is embodied as an LCD panel that transmits light emitted from a backlight through an LCD or displays a grayscale by adjusting the degree of transmission, the display panel 1700 may receive power necessary for the backlight through the power source supplier (not shown), and transmit the light emitted from the backlight through the LCD. The display panel 1700 may receive power to be used for a pixel electrode or a common electrode from the power source supplier (not shown), and control each LCD according to an image signal received from the image signal provider 1650 to display an image.

The backlight may emit light to the LCD, and may be embodied with a cold cathode fluorescent lamp (CCFL) and/or a light emitting diode (LED). Hereinafter, the backlight will be illustrated as including a light emitting diode and a light emitting diode driving circuit, but at the time of implementation, the backlight may be implemented with other configurations than the LED.

When the LED is used, the backlight may include an LED driver for driving the LED. The LED driver may be configured to provide a constant current corresponding to a brightness value to the LED so that the backlight may operate with the brightness corresponding to dimming information provided from the image signal provider 1650. The LED driver may not provide a constant current to the LED depending on a dimming signal.

In the case of the LED or OLED display panel 1700, the display panel 1700 may display an image corresponding to an image signal provided from the image signal provider 1650 and a driving power source supplied from the power source supplier. The display panel 1700 may include a plurality of pixels including an inorganic light emitting diode or an organic light emitting diode.

The inorganic light emitting diode may be a light emitting element fabricated by using an inorganic material, which is distinguished from the LED and OLED in this specification. To be specific, the inorganic light emitting diode may include a micro LED (micro LED). The micro LED may be a kind of inorganic light emitting element and refers to a miniaturized inorganic light emitting element having a size of 100 micrometers (μm) or less that emits light without a backlight or a color filter.

When the display panel 1700 is embodied as an inorganic light emitting diode, the display module 200, 300, 400, 600 and 900 or the display panel 500, 700 and 800 may be the display panel 1700.

An organic light emitting diode (OLED) may be a light emitting element manufactured by using a 'self-emitting organic material' that emits light by using an electroluminescent phenomenon that emits light when a current flows through a fluorescent organic compound.

The storage 1400 may store image contents. To be specific, the storage 1400 may receive video and image compressed image contents from the A/V processor 1300, store the image contents, and output the stored image contents to the A/V processor 1300 under the control of the processor 1600. The storage 1400 may be embodied with a hard disk, a non-volatile memory, a volatile memory, etc.

The controller 1500 may be embodied as a touch screen, a touch pad, a key button, etc. and provide a user operation of the display apparatus 1000. It has been exemplified that a control command is received through the controller 1500 provided in the display apparatus 1000, but the controller 1500 may receive a user operation from an external control device (e.g., a remote controller).

The communicator 1450 may perform communication with various types of external devices according to various types of communication methods. The communicator 1450 may include a Wi-Fi chip, a Bluetooth chip, etc. The processor 1600 may perform communication with various external devices through the communicator 1450. The communicator 1450 may perform communication with an external electronic device.

Although not shown in FIG. 9, the communicator 1450 may include a USB port to which a USB connector is connected, various external input ports for connecting to various external terminals such as a headset, a mouse, and a LAN, etc., a DMB chip for receiving and processing a digital multimedia broadcasting (DMB) signal, and the like.

The display apparatus 1000 may further include a power source supplier (not shown) and a sensing unit (not shown). The power source supplier may supply power to each constituent element of the display apparatus 1000. The power source supplier may generate a plurality of driving power sources having different potentials, and feedback control the voltage value of one driving power source.

The sensing unit may include a sensor for obtaining various sensing information. The sensing unit may include a color sensor for obtaining information on a color temperature in a background area near the display apparatus 1000. The sensing unit may include various sensing devices such as a camera, a movement sensor, etc.

The processor 1600 may control the overall operation of the display apparatus 1000. The processor 1600 may control the image signal provider 1650, and the display module 100 so that an image according to a control command received through the controller 1500 may be displayed. Referring to FIG. 9, the processor 1600 may include CPU, GPU, ROM and RAM.

Figure 10:
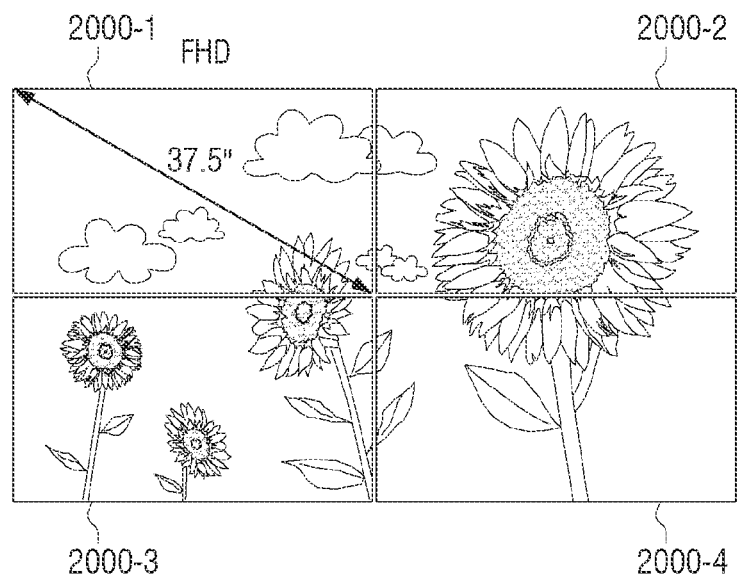
FIG. 10 is a view illustrating a bezel-less display panel according to an embodiment.
Figure 10:
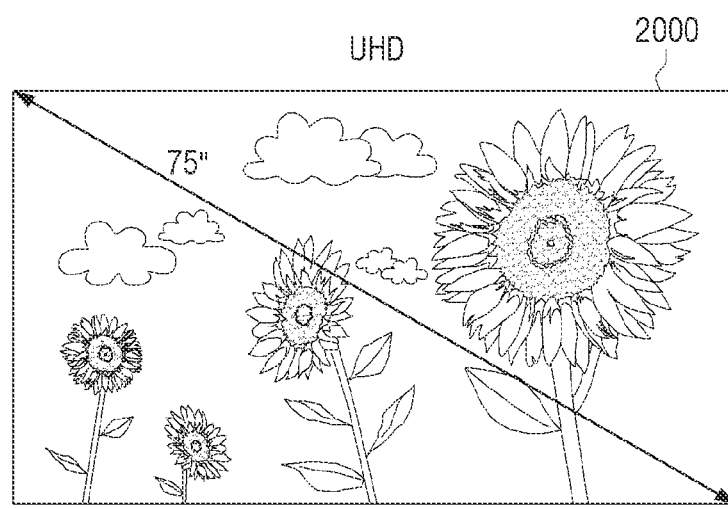

FIG. 10 is a view illustrating a bezel-less display panel according to an embodiment of the disclosure.

The bezel-less display modules capable of ESD protection 100, 200, 300, 400, 600 and 900 may be embodied by having the ESD protection circuit disposed in the pixel circuit area of the display module 100 according to the above-described various embodiments. Therefore, multiple instances of a display panel 2000 shown on the bottom of FIG. 10 may be formed together by connecting a plurality of bezel-less display modules 2000-1 to 2000-4 in a modular type as shown at the top of FIG. 10. In this case, visibility may not be deteriorated due the presence of the bezel area.

The display panel 100 according to various embodiments of the disclosure may be more effectively used for the case where an inorganic light emitting element including micro-LED constitutes a sub-pixel, but an example embodiment is not limited thereto. As described above, the display panel 100 may be efficiently applied to the OLED or LCD type display panel.

Although embodiments have been shown and described, it will be appreciated by those skilled in the art that changes may be made to these embodiments without departing from the principles and spirit of the disclosure. Accordingly, the scope of the disclosure is not construed as being limited to the described embodiments, but is defined by the appended claims as well as equivalents thereto.

What is claimed is:

1. A display module comprising:
   a substrate;
   a thin film transistor (TFT) layer formed on the substrate; and
   a plurality of pixels disposed on the TFT layer,
   wherein each pixel of the plurality of pixels comprises at least three inorganic light emitting elements,
   wherein the TFT layer comprises:
      a plurality of electro-static discharge (ESD) protection circuits; and
      a plurality of pixel circuits configured to drive the at least three inorganic light emitting elements for each pixel,
   wherein each ESD protection circuit of the plurality of ESD protection circuits is surrounded by a plurality of adjacent pixels among the plurality of pixels,
   wherein the plurality of adjacent pixels are arranged at a predetermined interval in a matrix array, and
   wherein each inorganic light emitting element of the at least three inorganic light emitting elements is mounted on and electrically connected to a corresponding pixel circuit among the plurality of pixel circuits.

2. The display module as claimed in claim 1, wherein each ESD protection circuit of the plurality of ESD protection circuits is located at a center of the plurality of adjacent pixels.

3. The display module as claimed in claim 1, wherein the plurality of pixels are arranged in a plurality of pixel lines, the plurality of pixel lines comprising a plurality of outermost pixel lines, and
   wherein the plurality of ESD protection circuits are disposed in the TFT layer such that none of the plurality of adjacent pixels is located in any outermost pixel line of the plurality of outermost pixel lines.

4. The display module as claimed in claim 1, wherein the plurality of pixels of the display module are arranged in an entire area of the substrate at the predetermined interval.

5. The display module as claimed in claim 1, wherein a first area of the TFT layer where each ESD protection circuit of the plurality of ESD protection circuits is disposed is different from a second area of the TFT layer where each pixel circuit of the plurality of pixel circuits is disposed.

6. The display module as claimed in claim 1, wherein a number of the plurality of ESD protection circuits included in the display module is less than a number of the plurality of pixels of the display module.

7. The display module as claimed in claim 1, wherein the plurality of pixels are arranged in a plurality of pixel lines, and pixels of the plurality of pixels that are disposed in an outermost pixel line among the plurality of pixel lines are spaced from an edge of the substrate by a distance equal to or less than the predetermined interval.

8. The display module as claimed in claim 1, wherein each ESD protection circuit among the plurality of ESD protection circuits is connected to at least one among a scan line, a data line, a power supply line, and a ground line for driving the plurality of pixel circuits.

9. The display module as claimed in claim 8, wherein each ESD protection circuit of the plurality of ESD protection circuits comprises a first type ESD protection circuit comprising two TFTs configured to bypass static electricity flowing through the data line or the power supply line to the ground line.

10. The display module as claimed in claim 8, wherein each ESD protection circuit of the plurality of ESD protection circuits comprises a second type ESD protection circuit comprising a transistor configured to cause the scan line, the data line, the power supply line, and the ground line to have equal voltages by a capacitive coupling effect.

11. The display module as claimed in claim 8, wherein the scan line, the data line, and the ground line are connected to a first type ESD protection circuit comprising two TFTs configured to bypass static electricity flowing through the data line to the ground line, and
wherein the power supply line is connected to a second type ESD protection circuit comprising a transistor configured to cause the scan line, the data line, the power supply line, and the ground line to have equal voltages by a capacitive coupling effect.

12. A display panel comprising a plurality of display modules that are consecutively arranged, each display module of the plurality of display modules comprising:
a substrate;
a thin film transistor (TFT) layer formed on the substrate; and
a plurality of pixels disposed on the TFT layer;
wherein each pixel of the plurality of pixels comprises at least three inorganic light emitting elements,
wherein the TFT layer comprises:
a plurality of electro-static discharge (ESD) protection circuits, and
a plurality of pixel circuits configured to drive the at least three inorganic light emitting elements for each pixel,
wherein each ESD protection circuit of the plurality of ESD protection circuits is surrounded by a plurality of adjacent pixels among the plurality of pixels,
wherein the plurality of adjacent pixels are arranged at a predetermined interval in a matrix array, and
wherein each inorganic light emitting element of the at least three inorganic light emitting elements is mounted on and electrically connected to a corresponding pixel circuit among the plurality of pixel circuits.

13. The display panel as claimed in claim 12, wherein a distance between pixels of the plurality of pixels that are arranged in a border region between a first display module and a second display module adjacent to the first display module among the plurality of display modules is equal to the predetermined interval.

14. The display panel as claimed in claim 12, wherein each ESD protection circuit of the plurality of ESD protection circuits is located at a center of the plurality of adjacent pixels.

15. The display panel as claimed in claim 12, wherein the plurality of pixels are arranged in a plurality of pixel lines, the plurality of pixel lines comprising a plurality of outermost pixel lines, and
wherein the plurality of ESD protection circuits are disposed in the TFT layer such that none of the plurality of adjacent pixels is located in any outermost pixel line of the plurality of outermost pixel lines.

16. The display panel as claimed in claim 12, wherein the plurality of pixels are arranged in an entire area of the substrate at the predetermined interval.

17. The display panel as claimed in claim 12, wherein a first area of the TFT layer where each ESD protection circuit of the plurality of ESD protection circuits is disposed is different from a second area of the TFT layer where each pixel circuit of the plurality of pixel circuits is disposed.

18. The display panel as claimed in claim 12, wherein a number of the plurality of ESD protection circuits included in each display module of the plurality of display modules is less than a number of the plurality of pixels of each display module of the plurality of display modules.

19. The display panel as claimed in claim 12, wherein the plurality of pixels are arranged in a plurality of pixel lines, and
pixels of the plurality of pixel lines that are disposed in an outermost pixel line among the plurality of pixel lines are spaced from an edge of the substrate by a distance equal to about ½ of the predetermined interval.

20. The display panel as claimed in claim 12, wherein each ESD protection circuit among the plurality of ESD protection circuits is connected to at least one among a scan line, a data line, a power supply line, and a ground line for driving the plurality of pixel circuits.

* * * * *